(12) United States Patent
Yamashita et al.

(10) Patent No.: US 9,129,578 B2
(45) Date of Patent: Sep. 8, 2015

(54) SHIFT REGISTER CIRCUIT AND DISPLAY DEVICE USING THE SAME

(71) Applicants: INNOCOM TECHNOLOGY (SHENZHEN) CO., LTD, Shenzhen, Guangdong Province (CN); CHIMEI INNOLUX CORPORATION, Miao-Li County (TW)

(72) Inventors: Keitaro Yamashita, Miao-Li County (TW); Te-Yu Lee, Miao-Li County (TW)

(73) Assignees: Innocom Technology (Shenzhen) Co., Ltd., Shenzhen, Guangdong Province (CN); Innolux Corporation, Miao-Li County (TW)

( * ) Notice: Subject to any disclaimer, the term of this patent is extended or adjusted under 35 U.S.C. 154(b) by 361 days.

(21) Appl. No.: 13/630,597

(22) Filed: Sep. 28, 2012

(65) Prior Publication Data

US 2014/0093252 A1    Apr. 3, 2014

(51) Int. Cl.
| | |
|---|---|
| *G09G 3/20* | (2006.01) |
| *G09G 3/30* | (2006.01) |
| *G09G 3/36* | (2006.01) |
| *H01L 27/28* | (2006.01) |
| *G02B 6/43* | (2006.01) |
| *H01L 27/32* | (2006.01) |
| *G09G 3/32* | (2006.01) |
| *G02F 1/133* | (2006.01) |

(52) U.S. Cl.
CPC ............ *G09G 3/3677* (2013.01); *H01L 27/288* (2013.01); *G02B 6/43* (2013.01); *G02F 2001/13312* (2013.01); *G09G 3/20* (2013.01); *G09G 3/3225* (2013.01); *G09G 3/3266* (2013.01); *G09G 3/3275* (2013.01); *G09G 2300/0408* (2013.01); *G09G 2310/0286* (2013.01); *G09G 2310/0289* (2013.01); *G09G 2310/08* (2013.01); *G09G 2360/14* (2013.01); *H01L 27/3227* (2013.01)

(58) Field of Classification Search
CPC .... H01L 27/288; H01L 27/3227; G02B 6/43; G09G 3/20; G09G 2310/0286; G09G 2310/0289
USPC ...................................... 345/80, 175
See application file for complete search history.

(56) References Cited

U.S. PATENT DOCUMENTS

| 4,393,516 | A * | 7/1983 | Itani ............................ 398/154 |
|---|---|---|---|
| 4,823,284 | A * | 4/1989 | Ward ............................ 358/1.8 |
| 6,424,326 | B2 * | 7/2002 | Yamazaki et al. ............... 345/77 |
| 2001/0028060 | A1* | 10/2001 | Yamazaki et al. ............... 257/72 |
| 2002/0135313 | A1* | 9/2002 | Koyama ...................... 315/169.3 |
| 2004/0217928 | A1* | 11/2004 | Yamazaki et al. ............... 345/81 |
| 2005/0243023 | A1* | 11/2005 | Reddy et al. .................... 345/48 |
| 2005/0248515 | A1 | 11/2005 | Naugler et al. |
| 2007/0205999 | A1* | 9/2007 | Akimoto et al. ............... 345/207 |
| 2007/0241998 | A1* | 10/2007 | Fish et al. ....................... 345/76 |

(Continued)

FOREIGN PATENT DOCUMENTS

TW    201236001 A1    9/2012

*Primary Examiner* — Michael J Eurice
(74) *Attorney, Agent, or Firm* — Muncy, Geissler, Olds & Lowe, P.C.

(57) ABSTRACT

The display device according to the present invention comprises a substrate and at least one optical coupler having an optical receiver and an optical transmitter formed on the substrate, wherein the optical transmitter transmits an optical signal to the optical receiver.

15 Claims, 22 Drawing Sheets

(56) References Cited

U.S. PATENT DOCUMENTS

| | | | |
|---|---|---|---|
| 2009/0002357 A1* | 1/2009 | John et al. | 345/212 |
| 2009/0122951 A1* | 5/2009 | Tobita | 377/68 |
| 2010/0259956 A1* | 10/2010 | Sadwick et al. | 363/50 |
| 2011/0050658 A1* | 3/2011 | White et al. | 345/205 |
| 2011/0057187 A1* | 3/2011 | Sakakura et al. | 257/43 |
| 2011/0142191 A1* | 6/2011 | Tobita et al. | 377/64 |
| 2013/0075761 A1* | 3/2013 | Akiyama | 257/80 |

* cited by examiner

SHIFT REGISTER CIRCUIT AND DISPLAY DEVICE USING THE SAME

BACKGROUND OF THE INVENTION

1. Field of Invention

The present invention relates to a shift register circuit and a display device using the same.

2. Related Art

Since the flat display device such as liquid crystal display (LCD) device or AMOLED (Active Matrix Organic Light Emitting Diode) display device has the advantages, such as thinner, lighter, lower power consumption, less radiation, compatible with semiconductor manufacturing processes, etc., it is widely applied to various electronic products.

In order to decrease the size of the flat display device, the driving circuit can be integrated onto the substrate of the flat display device. For example, the shift register circuit can be formed directly on the substrate of the LCD or OLED panel. However, in order to mitigate the undesired influence caused by the leakage current of thin film transistor (TFT), especially Indium-Gallium-Zinc Oxide TFT (IGZO TFT), the shift register is usually configured with additional TFTs.

FIG. 1 is a circuit diagram showing a conventional shift register, and FIG. 2 is a schematic graph showing I-V curve of TFT in FIG. 1. Referring to FIG. 1, a shift register includes fifteen n-type thin film transistors (TFT) and seven capacitors. This shift register can be applied to the scan driving circuit or the data driving circuit of the active matrix liquid crystal display or active matrix OLED display. After receiving the carry signal, the shift register then outputs a pulse signal and transfers the carry signal to the next shift register.

The TFTs of the shift register in FIG. 1 is implemented with IGZO TFTs. Although the shift register in FIG. 1 can avoid the drawback of IGZO TFT that the threshold voltage is negative as shown in FIG. 2, this shift register needs considerable amount of TFTs and capacitors. Because these components are comprised so as to make the TFT properly turn off and on, it causes that the layout of the entire shift registers is really huge. Thus, it is difficult to make the frame of the display panel thinner.

Therefore, it is an important subjective of the present invention to provide a display device and shift register which can transmit signals with compact electronic elements and less electric noise.

SUMMARY OF THE INVENTION

In view of the foregoing subjective, an object of the present invention is to provide a display device and a shift register circuit that utilize optical elements to transmit signal.

The display device according to the present invention comprises a substrate and at least one optical coupler having an optical receiver and an optical transmitter formed on the substrate, wherein the optical transmitter transmits an optical signal to the optical receiver.

In the embodiment, the optical transmitter transforms an electrical signal to the optical signal, and the optical receiver transforms the optical signal to the electrical signal.

In the embodiment, the optical transmitter comprises an organic light emitting diode (OLED), the optical receiver comprises an optical thin film transistor (TFT), and the conductance of the optical thin film transistor is controlled by the optical signal.

In the embodiment, the display device further comprises a plurality of shift registers, and each shift register comprises a first switch, a second switch, a bootstrapping capacitor. The first switch couples a clock signal to an output terminal. The second switch couples the clock signal to the optical transmitter. The bootstrapping capacitor couples the control node of the first switch to the output terminal. The optical signal controls the optical receiver to electrically charge the bootstrapping capacitor such that the first switch and the second switch are turned on so as to output a pulse signal on the output terminal and transfer the optical signal from the optical transmitter. The optical receiver is controlled by the optical signal to couple a first voltage potential to the control nodes of the first switch and the second switch.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
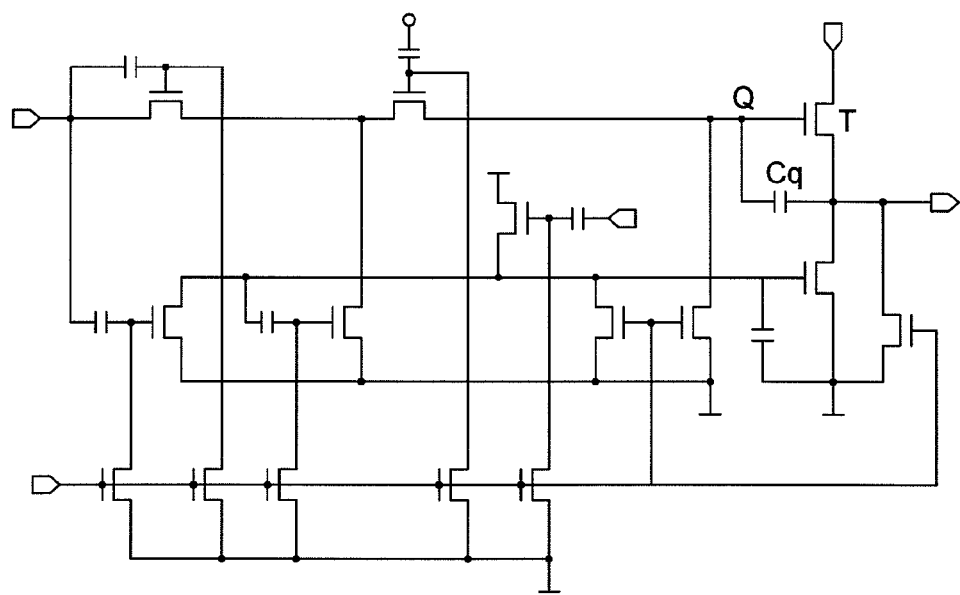
FIG. 1 is a circuit diagram showing a conventional shift register.
Figure 2:
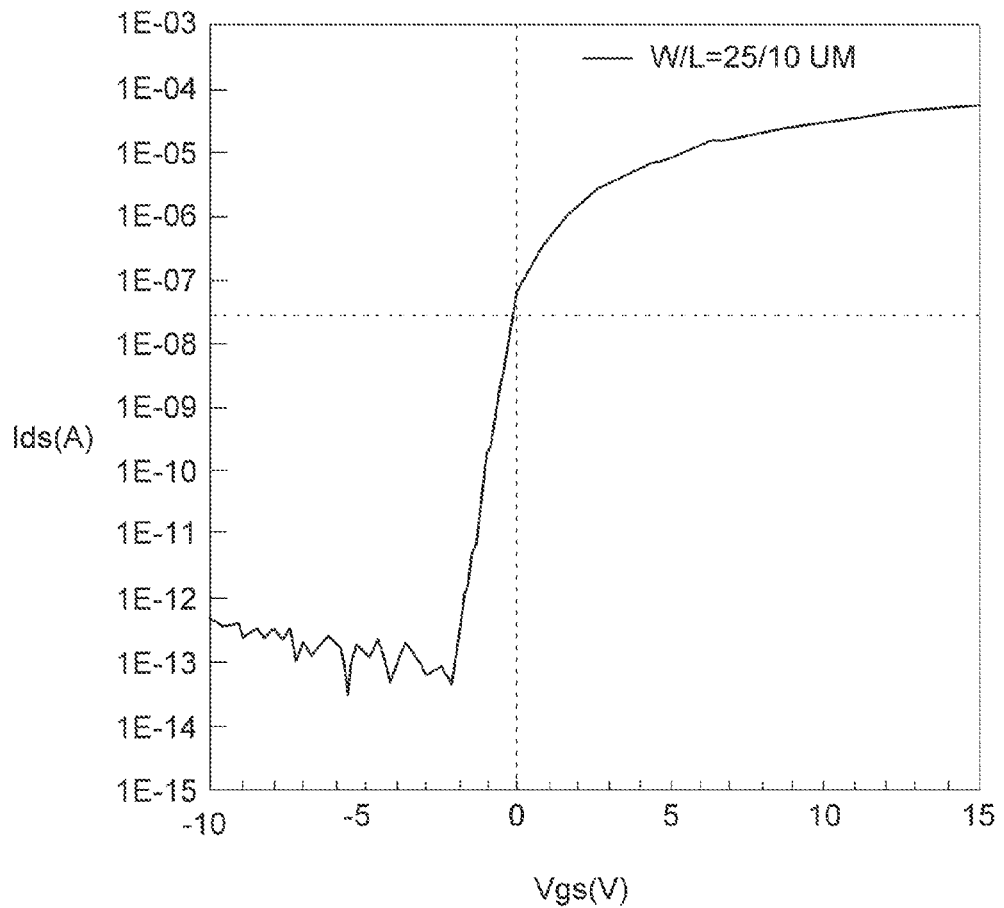
FIG. 2 is a schematic graph showing I-V curve of TFT in FIG. 1.
Figure 3:
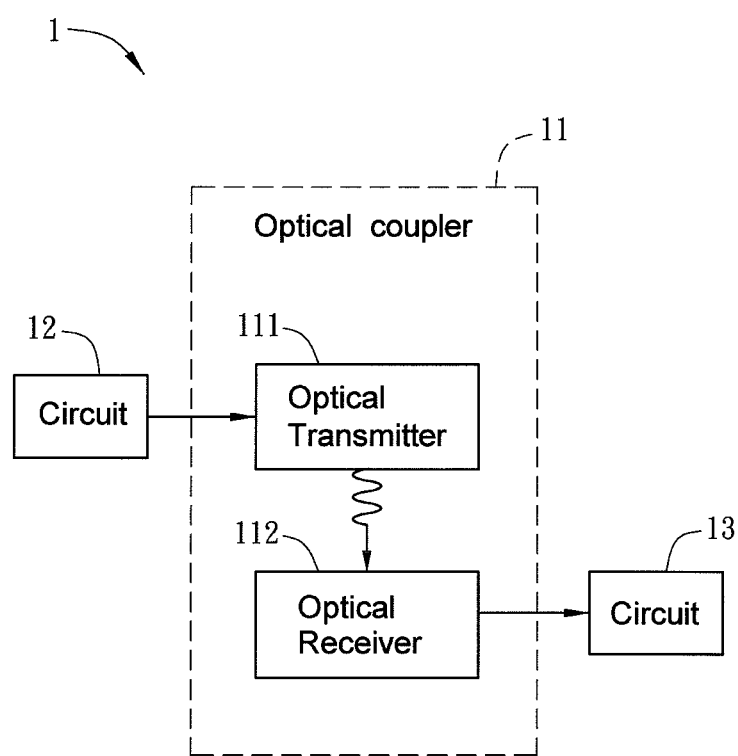
FIG. 3 is a block diagram of an electronic device according to a preferred embodiment of the present invention.

FIG. 3 is a block diagram of an electronic device according to a preferred embodiment of the present invention. With reference to FIG. 3, an electronic device 1 includes an optical coupler 11, and two circuits 12 and 13. The circuit 12 transmits a signal to the circuit 13 by the optical coupler 11. The circuits 12 and 13 are not concerned with each other and do not send electrical signal to the other one. Instead of electrical wires, the optical coupler 11 implements signal transmission between the circuits 12 and 13. Thus, the circuit 12 or 13 will not suffer electrical noise from the other one. Also the circuit 12 or 13 will not suffer electrical requirement such as TFT threshold voltage from the other one.

The optical 11 has an optical transmitter 111 and an optical receiver 112 which are electrically independent but optically coupled. The optical transmitter 111 is electrically connected to the circuit 12 but electrically disconnected to the optical receiver 112 or the circuit 13, and the optical receiver 112 is electrically disconnected to the circuit 12. The optical transmitter 111 transforms an electrical signal from the circuit 12 to the optical signal. After the receiver 112 receives the optical from the optical transmitter 111, the optical receiver 112 transforms the optical signal to the electrical signal into the circuit 13.

The electronic device 1 can be a display device such as liquid crystal display (LCD) or organic light emitting display (OLED) device, especially active matrix LCD (AM-LCD) or active matrix OLED (AM-OLED) device. These display devices can be or applied to television, monitor or display panel. For example, television or monitor may include the display panel such as AM-LCD panel or AM-OLED panel. The substrate of the display panel can be glass or plastic substrate, and it may be coated with buffer layer or other films. The optical receiver 112 and the optical transmitter 111 can be formed on the substrate of the display panel.

As to the OLED device, it includes a plurality of pixels defined on its substrate. Each pixel has a light emitting unit for displaying. The light emitting unit and the optical transmitter can be organic light-emitting diode (OLED). For example, the wavelength of the optical signal is different from the wavelength of the light emitted by the light emitting unit for displaying. The wavelength of the optical signal is within infrared range or ultraviolet range.

Generally, active matrix display panel includes driving circuits, pixels and lines for connecting the driving circuits and the pixels. The pixels are formed and arranged in a matrix located on a display zone of the panel, and they are electrically connected to the driving circuits. The driving circuits, which are not viewable by user, locate on non-display zone such as edge side of the panel.

The driving circuits such as scan driver or data driver are entirely or partly implemented with chip assembled on the substrate of the display panel. The lines for connecting the driving circuits and the pixels are formed on the substrate, and they include scan lines and data lines. The scan driver is electrically connected to the scan lines and thus scans each scan line in sequence. The data driver is electrically connected to the data lines for writing image data to pixels. The pixel can be written with the image data by the data driver when the pixel is scanned by the scan driver.

In general, the scan driver and the data driver include shift registers. The optical coupler is appropriated to deliver the carry signal through the shift registers. For example, the shift registers are optically coupled in series, each register receives a carry signal from the previous shift register and then transfer this carry signal to the next shift register. Each shift register can transmit or receive the carry signal by the optical coupler, and thus each shift register can be electrically disconnected to one another. For example, circuits 12 and 13 can be the neighborhood shift registers, the circuit 12 transfer the carry signal to the circuit 13 by the optical transmitter 111, and the circuit 13 obtains the carry signal from the circuit 12 by the optical transmitter 112.

The shift register and other parts of the scan driver or data driver can be implemented with IC. Otherwise, the shift registers may not be implemented with IC, and they can be formed on the substrate. In the circumstance, the scan driver or the data driver does not include the shift registers. The optical coupler is appropriated to couple the neighbor shift registers.

Figure 4:
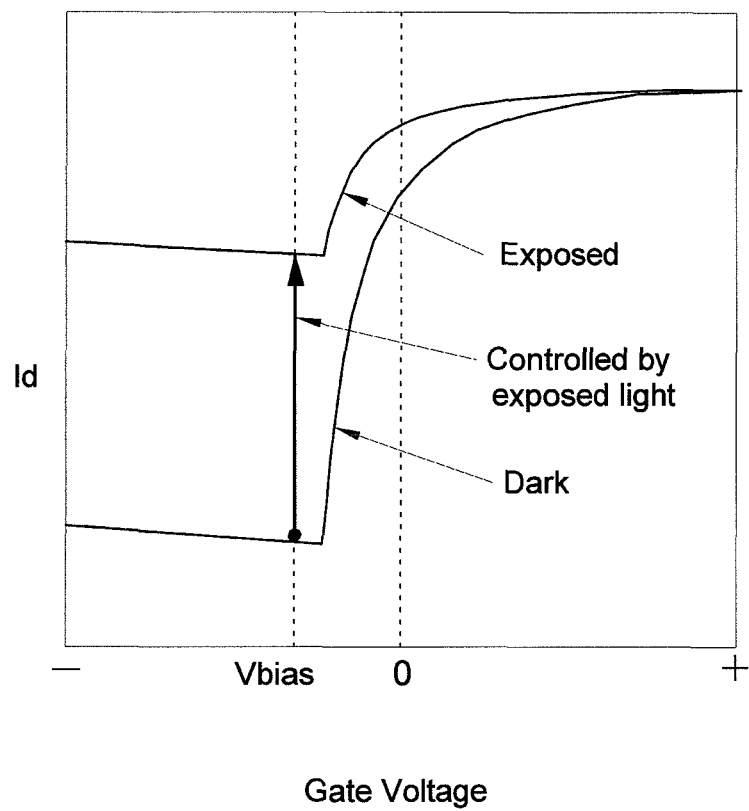
FIG. 4 is a schematic graph showing I-V curve of optical conducted TFT.

In addition, the optical transmitter 111 may include an organic light emitting diode (OLED), and the optical receiver 112 may include an optical thin film transistor (TFT), and the conductance of the optical thin film transistor is controlled by the optical signal. The optical TFT can be IGZO TFT, and its I-V curve is illustrated in FIG. 4. It is clearly that light controls the conductance of the optical TFT of the optical receiver. The undesired influence caused by the leakage current of IGZO TFT can be effectively mitigated.

Furthermore, the optical coupler is not limited to the shift register, and it may be applied to other circuit on the display panel. In addition, the shift register is not limited to display device, and it may be applied to other device or circuit.

The detailed description will be illustrated hereinafter.

FIGS. 5A-5E are schematic diagrams showing elements arrangement of a display device according to an embodiment of the present invention. Referring to FIGS. 5A-5E, display devices 2a-2e includes a substrate 20 and an optical coupler 21. The substrate 20 can be glass or plastic substrate, and it may be coated with buffer layer or other films. The optical coupler 21 includes an optical transmitter 211, an optical receiver 212 and an optical reflector 213 formed on the substrate 20. The optical transmitter 211 and the optical receiver 212 can be above or directly on the substrate 20, and the optical reflector 213 can be above or directly on the substrate 20 either. The optical reflector 213 reflects the optical signal from the optical transmitter 211 to the optical receiver 212, and its material can be metal such as aluminum or copper. The optical reflector 213 can be disposed above or below the optical transmitter 211 and the optical receiver 212. It is also practicable that two optical reflectors 213a, 213b are disposed respectively above and below the optical transmitter 211 and the optical receiver 212.

Due to focus on the arrangement of the optical coupler and the optical reflector on the substrate, other elements such as buffer layer, thin film transistor, transparent electrode, lighting element, or liquid crystal layer is not shown in the figures and explained here. In addition, the optical transmitter 211 and the optical receiver 212 can be respectively electrically connected to two circuits which are disconnected to each other. These circuits are not shown here.

Figure 5A:
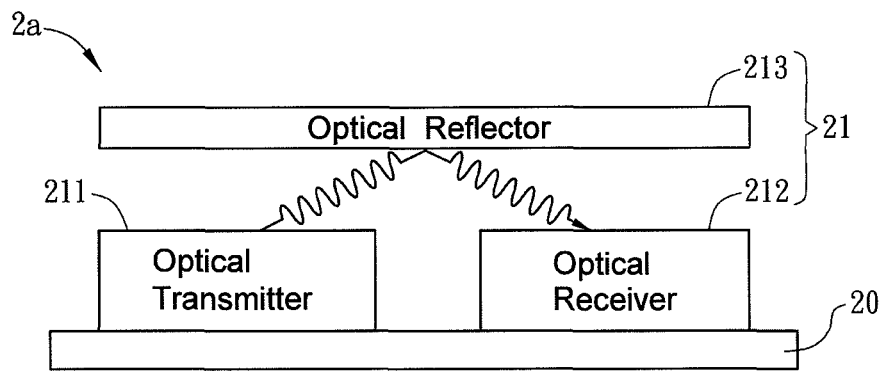
FIGS. 5A-5E are schematic diagrams showing elements arrangement of a display device according to an embodiment of the present invention.

Referring to FIG. 5A, the optical transmitter 211 and an optical receiver 212 are formed directly on the substrate 20, and the optical reflector 213 is placed above the optical transmitter 211 and the optical receiver 212. The optical transmitter 211 is top emission type element and emits light as the optical signal upwardly. The optical reflector 213 reflects the light from the transmitter 211 downwardly to the optical receiver 212.

Figure 5B:
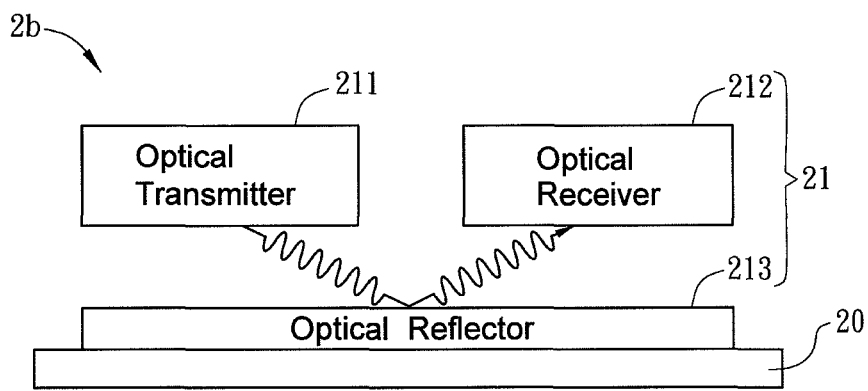

Referring to FIG. 5B, the optical transmitter 211 and an optical receiver 212 are formed above the substrate 20, and the optical reflector 213 is placed directly on the substrate 20 and below the optical transmitter 211 and the optical receiver 212. The optical transmitter 211 is bottom emission type element and emits light as the optical signal downwardly. The optical reflector 213 reflects the light from the transmitter 211 upwardly to the optical receiver 212. In addition, the optical reflector 213 may be above the substrate 20 as shown in FIG. 5B, but it may also be below the substrate 20.

Figure 5C:
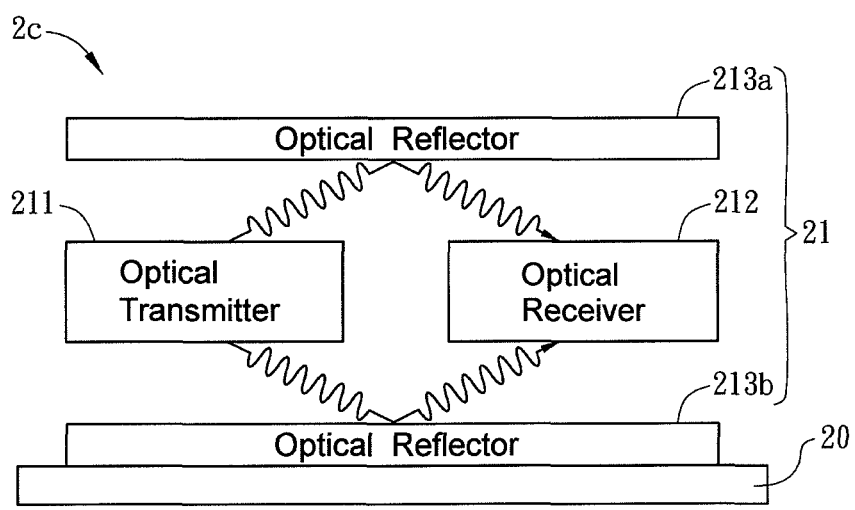

Referring to FIG. 5C, the optical transmitter 211 and an optical receiver 212 are formed above the substrate 20. The optical reflector 213a is above the optical transmitter 211 and the optical receiver 212, and the optical reflector 213b is below the optical transmitter 211 and the optical receiver 212. The optical transmitter 211 emits light as the optical signal upwardly and downwardly. The optical reflectors 213a and 213b respectively reflect the light from the transmitter 211 downwardly and upwardly to the optical receiver 212. In addition, the optical reflector 213b may be above the substrate 20 as shown in FIG. 5C, but it may also be below the substrate 20.

Figure 5D:
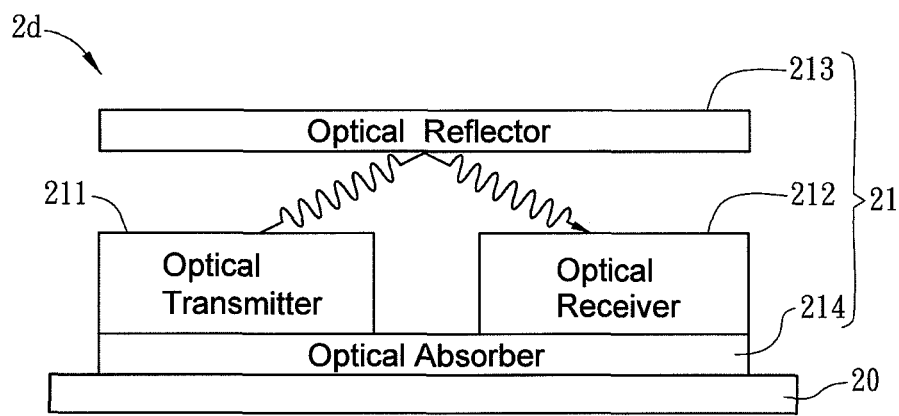
Figure 5E:
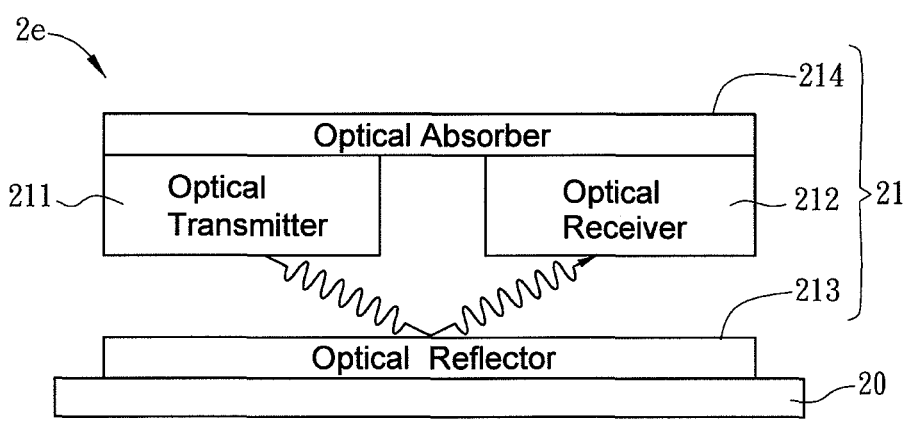

Referring to FIGS. 5D and 5E, the optical coupler 21 further comprises an optical absorber 214 for preventing the optical coupler 21 from environment optical interference. The optical absorber 214 can be disposed respect to the optical reflector 213. For example, the optical absorber 214 is opposite to the optical reflector 213, and the optical transmitter 211 and the optical receiver 212 are located between the optical reflector 213 and the optical absorber 214. The material of the optical absorber 214 can be the same with the material of the black matrix or ring seal of the display panel.

In FIG. 5D, the optical absorber 214 is below the optical transmitter 211 and the optical receiver 212, and the optical reflector 213 is above the optical transmitter 211 and the optical receiver 212. In addition, the optical absorber 214 may be above the substrate 20 as shown in FIG. 5D, but it may also be below the substrate 20.

In FIG. 5E, the optical absorber 214 is above the optical transmitter 211 and the optical receiver 212, and the optical reflector 213 is below the optical transmitter 211 and the optical receiver 212. In addition, the optical reflector 213 may be above the substrate 20 as shown in FIG. 5E, but it may also be below the substrate 20.

In general, the optical reflector 213 can reflect light inside or outside the optical coupler 21, and thus optical reflector 213 can prevent the optical coupler 21 from environment optical interference. In addition, the optical reflector 213 and the optical absorber 214 can prevent the light emitted by the optical transmitter 211 from being leaking out. If the optical coupler 21 is applied to a display panel or display device, the optical signal will be restricted within the optical coupler 21 and will not have influence on displaying.

Figure 6:
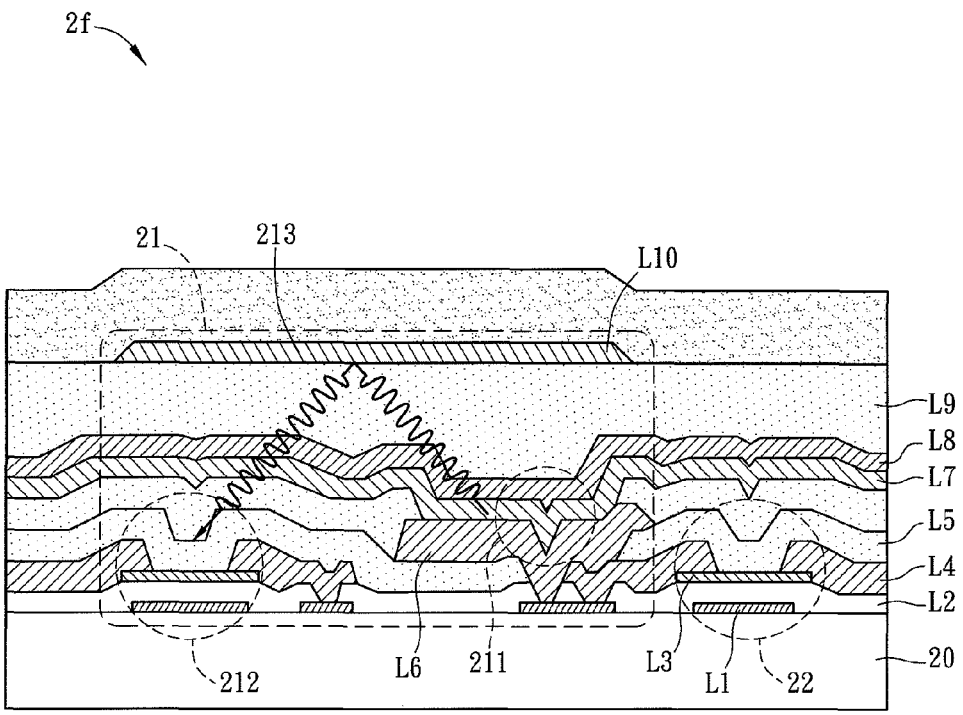
FIG. 6 is a schematic diagram showing an example of the display device in FIG. 5A.

FIG. 6 is a schematic diagram showing an example of the display device in FIG. 5A. Referring to FIG. 6, the display device 2f further includes layers L1-L10 formed on the substrate 20. The layer L1 formed on the substrate 20 is a conductive layer which can be patterned with electrode or conductive line. The patterned electrode of layer L1 can be served as a gate of TFT, and the patterned conductive line of layer L1 can be served as voltage power line or signal line. The material of layer L1 can be metal. The layer L2 is an insulation layer formed on the substrate 20 and the layer L1. The layer L3 is formed on the layer L2 and patterned to be channel of TFT. The layer L4 is a conductive layer which is formed on the layers L2, L3 and patterned to be served as source/drain electrodes. The layer L5 is a passivation layer formed on the layers L2-L4. The layer L6 is a conductive layer which is patterned to be served as one electrode of light emitting element. The layer L7 is formed on the layer L6 and includes electroluminescence material. The layer L8 is a transparent conductive layer formed on the layer L7, and the material of layer L8 can be ITO. The layer L9 is a planarization layer formed on the layer L8. The layer 10 formed on layer L9 is an optical element, and the material of the layer 10 can be metal.

The optical coupler 21 includes optical transmitter 211, optical receiver 212 and optical reflector 213. The layer L10 is served as the optical reflector 213, and it covers the entire optical transmitter 211 and optical receiver 212. The optical transmitter 211 includes a light-emitting element such as light-emitting diode (LED) formed of the layers L6-L8, and the layers L6 and L8 serve as two electrodes of the LED. In addition, the light-emitting element can be organic LED (OLED) if the material of the layer L7 is organic. The optical receiver 212 includes an optical thin film transistor (TFT) formed of the layers L1-L4, and the conductance of the optical thin film transistor is dependent on the obtained light. The TFT of the receiver 212 and other TFT 22 of the display 2f can be formed simultaneously. The TFT 22 may be other elements of the driving circuit or the pixel. Each of the TFT of the optical receiver 212 and the TFT 22 can be an enhancement type TFT, a depletion type TFT, a combination of enhancement type TFT and a depletion type TFT, an organic TFT, an oxide TFT, an Indium-Gallium-Zinc Oxide TFT, a low temperature poly-crystalline silicon TFT (LTPS-TFT), or an amorphous silicon TFT (aSi-TFT).

When the LED or OLED of the optical transmitter 211 is controlled and by an electrical signal to emit the light, the reflector 213 reflects the light to the optical receiver 212. The optical receiver 212 outputs an electrical signal on the source of its TFT based on the obtained light.

FIGS. 7A-7F are schematic diagrams showing elements arrangement of a display device according to an embodiment of the present invention. Referring to FIGS. 7A-7E, display devices 3a-3f includes a substrate 30 and an optical coupler 31. The substrate 30 can be glass or plastic substrate, and it may be coated with buffer layer or other films. The optical coupler 31 includes an optical transmitter 311, an optical receiver 312 and an optical diffuser 315 formed on the substrate 30. The optical transmitter 311 and the optical receiver 312 can be above or directly on the substrate 30, and the optical diffuser 315 can be above or directly on the substrate 30 either. The optical diffuser 315 guides the light within the optical diffuser 315 from the optical transmitter 311 to the optical receiver 312. The optical diffuser 315 can be disposed above or below the optical transmitter 311 and the optical receiver 312. It is also practicable that two optical diffuser are disposed respectively above and below the optical transmitter 311 and the optical receiver 312.

Due to focus on arrangement of the optical coupler and the optical diffuser on the substrate, other elements such as buffer layer, thin film transistor, transparent electrode, lighting element, or liquid crystal layer is not shown in the figures and explained here. In addition, the optical transmitter 311 and the optical receiver 312 can be respectively electrically connected to two circuits which are disconnected to each other. These circuits are not shown here.

Figure 7A:
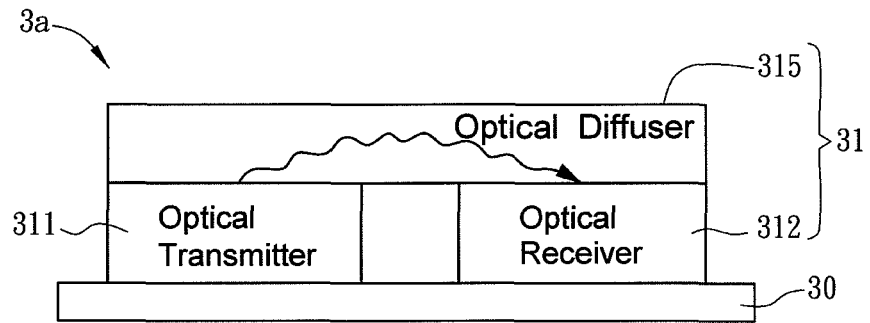
FIGS. 7A-7F are schematic diagrams showing elements arrangement of a display device according to an embodiment of the present invention.

Referring to FIG. 7A, the optical transmitter 311 and an optical receiver 312 are formed directly on the substrate 30, and the optical diffuser 315 is placed above the optical transmitter 311 and the optical receiver 312. The optical transmitter 311 is top emission type element and emits light as the optical signal upwardly. The optical diffuser 315 guides the light within the optical diffuser 315, and then guides the light downwardly to the optical receiver 312.

Figure 7B:
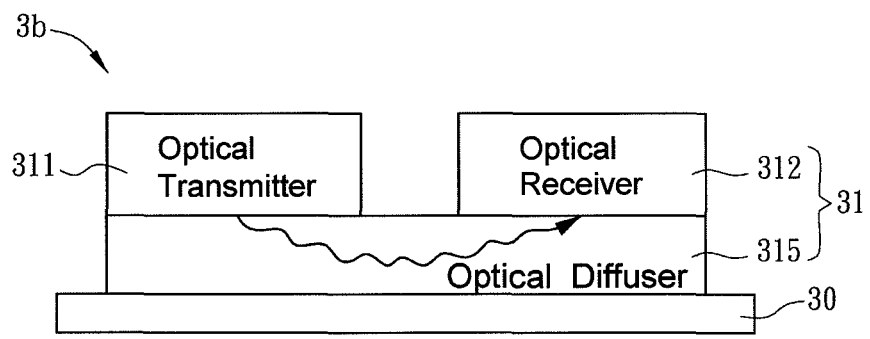

Referring to FIG. 7B, the optical transmitter 311 and an optical receiver 312 are formed above the substrate 30, and the optical diffuser 315 is placed directly on the substrate 30 and below the optical transmitter 311 and the optical receiver 312. The optical transmitter 311 is bottom emission type element and emits light as the optical signal downwardly. The optical diffuser 315 guides the light within the optical diffuser 315, and then guides the light upwardly to the optical receiver 312. In addition, the optical diffuser 315 may be above the substrate 30 as shown in FIG. 7B, but it may also be below the substrate 30.

Figure 7C:
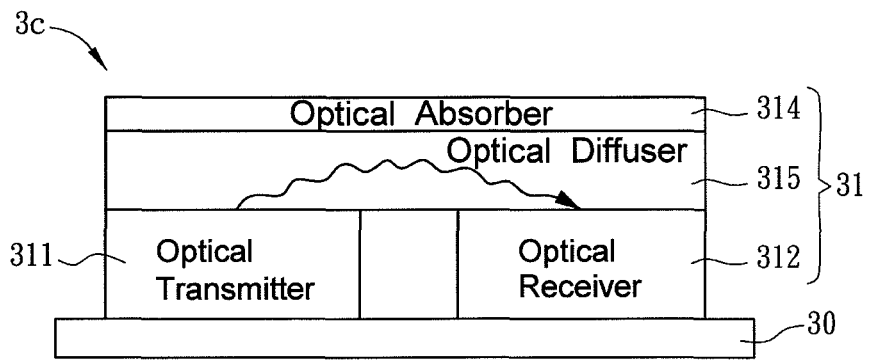
Figure 7D:
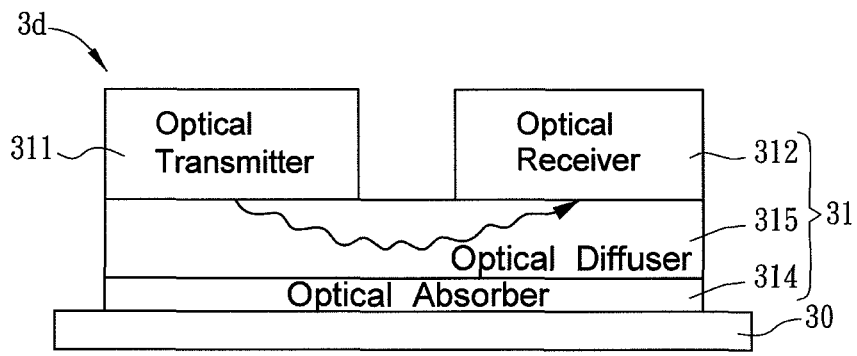

Referring to FIGS. 7C and 7D, the optical coupler 31 further includes an optical absorber 314 for preventing the optical coupler 31 from environment optical interference. The optical absorber 314 can be disposed respect to the optical diffuser 315. For example, the optical absorber 314 is next to the optical diffuser 315, and the optical diffuser 315 is between the optical absorber 314 and both the optical transmitter 311 and the optical receiver 312.

Referring to FIG. 7C, the optical transmitter 311 and the optical receiver 312 are formed directly on the substrate 30, and the optical diffuser 315 is placed above the optical transmitter 311 and the optical receiver 312. The optical absorber 314 is above the optical diffuser 315.

Referring to FIG. 7D, the optical transmitter 311 and an optical receiver 312 are formed above the substrate 30, and the optical diffuser 315 is placed directly on the substrate 30 and below the optical transmitter 311 and the optical receiver 312. The optical absorber 314 is below the optical diffuser 315. In addition, the optical diffuser 315 and/or optical absorber 314 may be above the substrate 30 as shown in FIG. 7D, but they may also be both below the substrate 30.

Figure 7E:
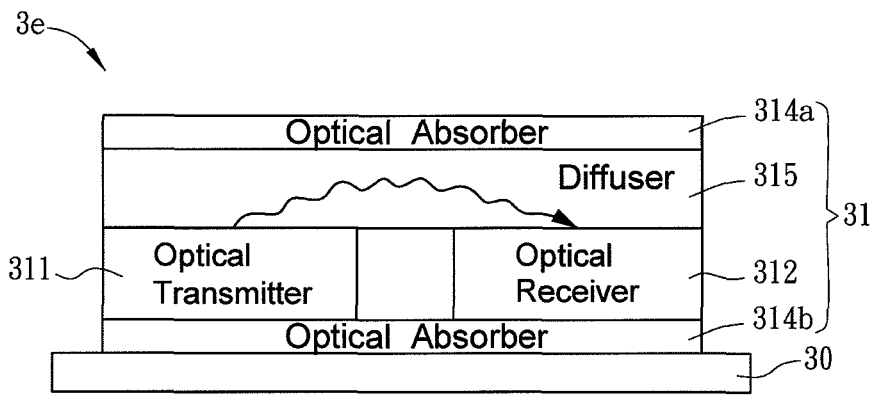
Figure 7F:
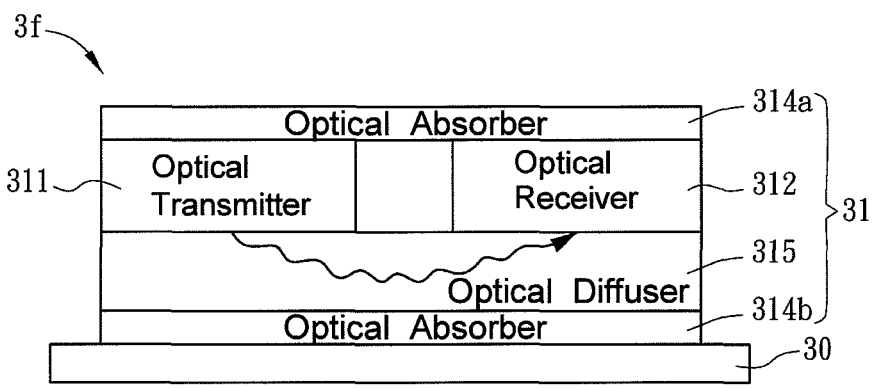

In FIGS. 7E and 7F, the optical coupler 31 has two optical absorbers 314a and 314b. The optical absorber 314a is above the optical transmitter 311 and the optical receiver 312, and the optical absorber 314b is below the optical transmitter 311 and the optical receiver 312.

Referring to FIG. 7E, the optical diffuser 315 is above the optical transmitter 311 and the optical receiver 312. The optical absorber 314a is above the optical diffuser 315. In addition, the optical absorber 314b may be above the substrate 30 as shown in FIG. 7E, but it may also be below the substrate 30.

Referring to FIG. 7F, the optical diffuser 315 is below the optical transmitter 311 and the optical receiver 312. The optical absorber 314b is below the optical diffuser 315. In addition, the optical diffuser 315 and/or optical absorber 314b may be above the substrate 30 as shown in FIG. 7F, but they may also be both below the substrate 30.

Figure 8:
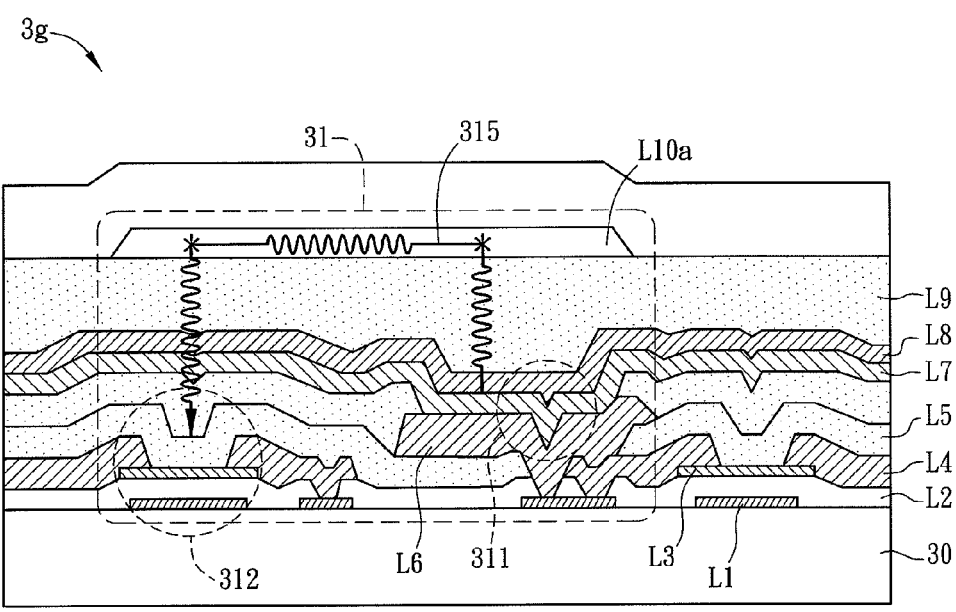
FIG. 8 is a schematic diagram showing an example of the display device in FIG. 7A.

FIG. 8 is a schematic diagram showing an example of the display device in FIG. 7A. Referring to FIG. 8, the display device 3g further includes layers L1-L9 and L10a formed on the substrate 30. Because the layers L1-L9 in FIG. 8 are similar to the layers L1-L9 in FIG. 6, it is not repeated the detail of the layers L1-L9 here.

The optical coupler 31 includes optical transmitter 311, the optical receiver 312 and the optical diffuser. Because the optical transmitter 311 and the optical receiver 312 are similar to the optical transmitter 211 and the optical receiver 212 in FIG. 6, it is not repeated the detail here. The layer L10a is served as the optical diffuser, and it may cover the entire optical transmitter 311 and optical receiver 312.

FIGS. 9A-9D are schematic diagrams showing elements arrangement of a display device according to an embodiment of the present invention. Referring to FIGS. 9A-9D, display devices 4a-4d includes a substrate 40 and an optical coupler 41. The substrate 40 can be glass or plastic substrate, and it may be coated with buffer layer or other films. The optical coupler 41 includes an optical transmitter 411, an optical receiver 412. The optical transmitter 411 and the optical receiver 412 are vertically arranged on the substrate 40. The optical reflector or optical diffuser is not necessary since the optical transmitter 411 directly emit light to the optical receiver 412.

Due to focus on arrangement of the optical coupler and the optical diffuser on the substrate, other elements such as buffer layer, thin film transistor, transparent electrode, lighting element, or liquid crystal layer is not shown in the figures and explained here. In addition, the optical transmitter 411 and the optical receiver 412 can be respectively electrically connected to two circuits which are disconnected to each other. These circuits are not shown here.

In FIGS. 9A-9D, the optical receiver 412 is formed directly on the substrate 40, and the optical transmitter 411 is formed on the optical receiver 412. The optical transmitter 411 is bottom emission type element and emits light as the optical signal downwardly.

Figure 9A:
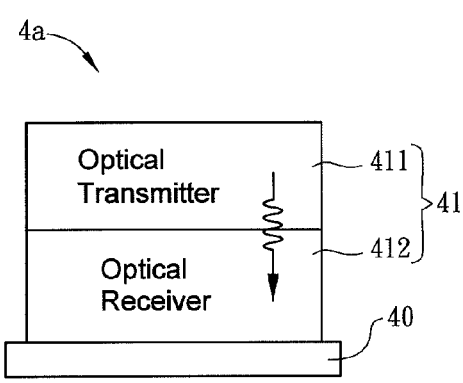
FIGS. 9A-9D are schematic diagrams showing elements arrangement of a display device according to an embodiment of the present invention.
Figure 9B:
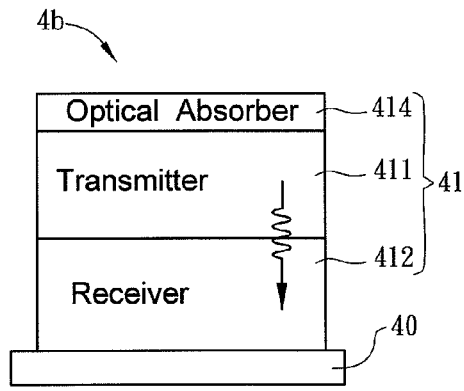
Figure 9C:
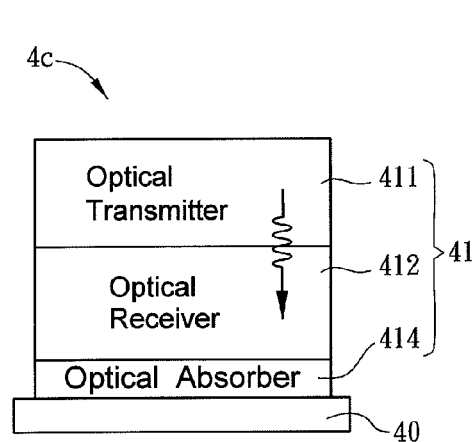

Referring to FIGS. 9B-9C, the optical coupler 41 has an optical absorber 414. In FIG. 9B, the optical absorber 414 is above the optical transmitter 411. In FIG. 9C, the optical absorber 414 is below the optical receiver 412.

Figure 9D:
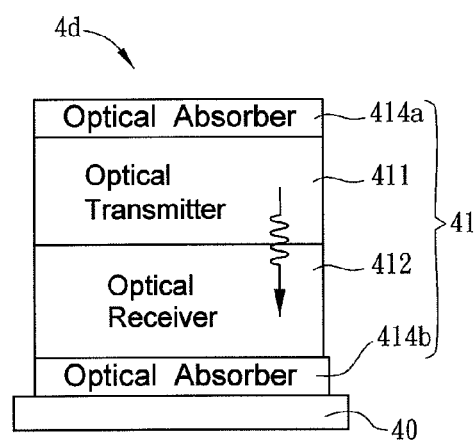

Referring to FIG. 9D, the optical coupler 41 has two optical absorbers 414a and 414b. The optical absorbers 414a and 414b are respectively above the optical transmitter 411 and below the optical receiver 412.

Figure 10:
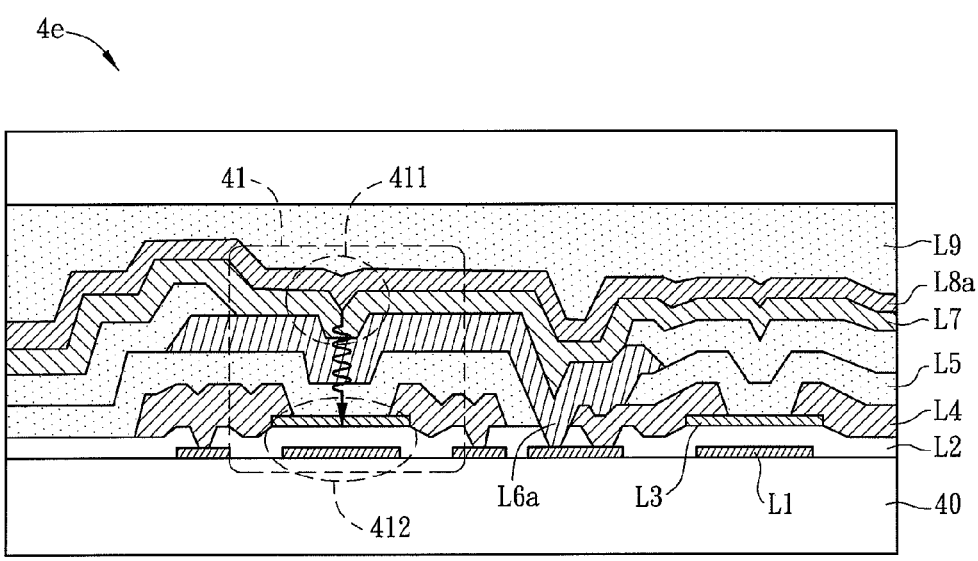
FIG. 10 is a schematic diagram showing an example of the display device in FIG. 9A.

FIG. 10 is a schematic diagram showing an example of the display device in FIG. 9A. Referring to FIG. 10, the display device 4e further includes layers L1-L5, L6a, L7, L8a and L9 formed on the substrate 30. Because the layers L1-L5, L7 and L9 in FIG. 10 are similar to the layers L1-L5, L7 and L9 in FIG. 6, it is not repeated the detail of the layers L1-L5, L7 and L9 here.

The layer L6a formed on the layer L5 is transparent conductive layer, which can be ITO. The layer L8a is a conductive layer, and it can be a metal layer served as a reflector. The optical coupler 41 includes the optical transmitter 411 and the optical receiver 412. The optical transmitter 411 is formed of the layers L6a, L7 and L8a, and the optical receiver 412 is formed of the layers L1-L4.

Figure 11:
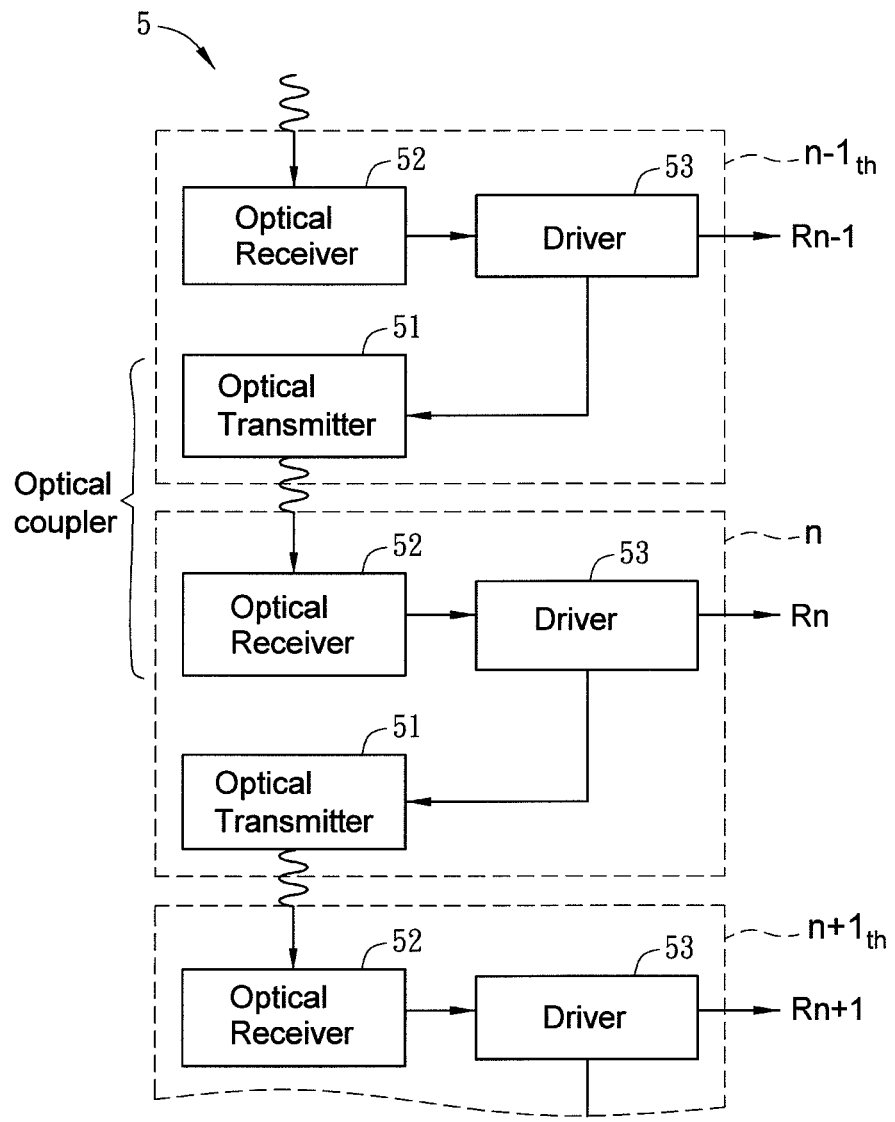
FIG. 11 is a block diagram showing a shift register circuit according to an embodiment of the present invention.

FIG. 11 is a block diagram showing a shift register circuit according to an embodiment of the present invention. Referring to FIG. 11, a shift register circuit 5 includes a plurality of shift registers optically coupled in series. Due to brief and clear explanation, only $n-1_{th}$, $n_{th}$, $n+1_{th}$ shift registers are illustrated in the figure.

Each shift register includes an optical transmitter 51, an optical receiver 52 and a driver 53. In $n_{th}$ shift register, the optical receiver 52 receives an optical signal from the previous $n-1_{th}$ shift register. The driver 53 is electrically connected to the optical receiver 52 to output a pulse signal at output terminal Rn according to the received optical signal. The optical transmitter 51 is electrically connected to the driver 53 to transfer the optical signal. In detail, the optical transmitter 51 transmits the optical signal to the next $n+1_{th}$ shift register based on the optical signal from the previous $n-1_{th}$ shift register.

Figure 12:
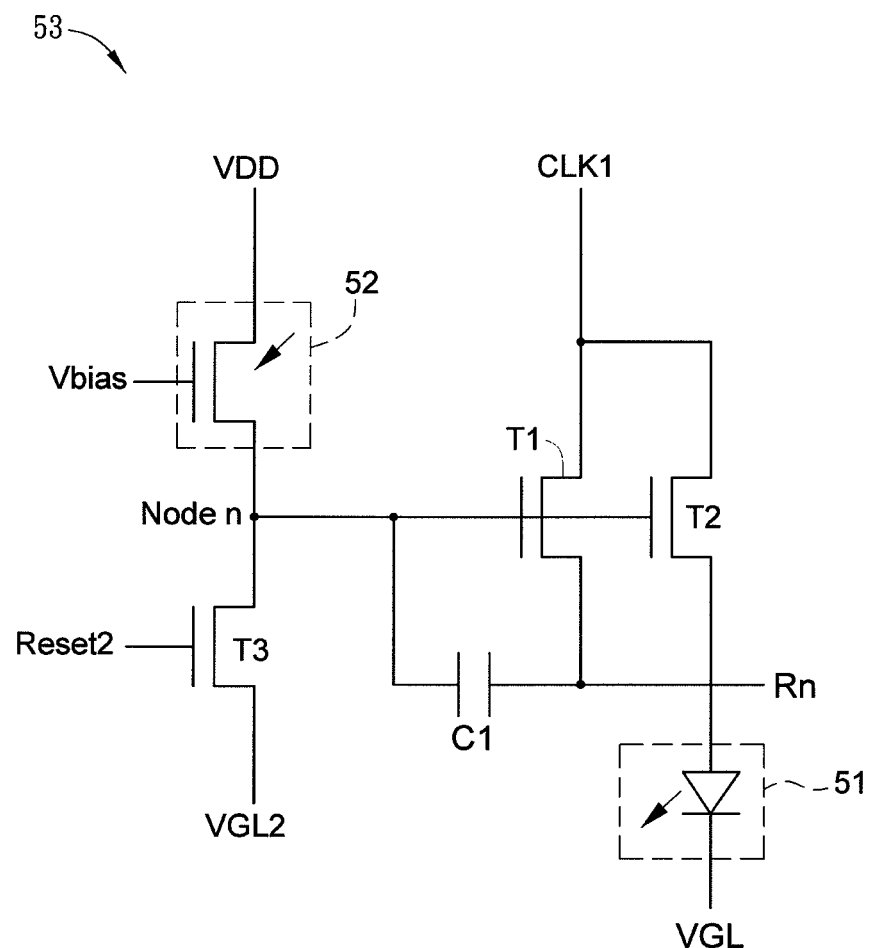
FIG. 12 is a circuit diagram showing an example of the shift register in FIG. 11.

FIG. 12 is a circuit diagram showing an example of the shift register in FIG. 11. Referring to FIG. 12, the driver 53 of the $n_{th}$ shift register includes a first switch T1, a second switch T2, a bootstrapping capacitor C1. The first switch T1 couples a clock signal CLK1 to the output terminal Rn. The second switch 12 couples the clock signal CLK1 to the optical transmitter 51. The bootstrapping capacitor C1 couples the control node of the first switch T1 to the output terminal Rn. The optical signal controls the optical receiver 52 to electrically charge the bootstrapping capacitor C1 such that the first switch T1 and the second switch T2 are turned on so as to output the pulse signal on the output terminal Rn and to transfer the optical signal from the optical transmitter 51. The optical receiver 52 is controlled by the optical signal to couple a voltage potential VDD to the control nodes of the first switch T1 and the second switch T2.

In the embodiment, Node n is electrically connected to the optical receiver 52, one node of the bootstrapping capacitor C1 and the gates of the switches T1 and T2. The switches T1 and T2 are TFT, and the gates of the switches T1 and T2 are served as control nodes. The optical transmitter 51 has an OLED, and the optical receiver 52 has an optical TFT. The conductance of the optical TFT is controlled by the optical signal. The gate of the optical TFT is coupled to a voltage potential Vbias.

In addition, two nodes of the optical transmitter 51 are respectively coupled to the second switch T2 and a voltage potential VGL. The driver 53 of the $n_{th}$ shift register includes a reset switch T3 for coupling the control node of the first switch T1 to a voltage potential VGL2. The voltages relationship of the voltage potentials should be Bias<VGL2<VGL.

Figure 13:
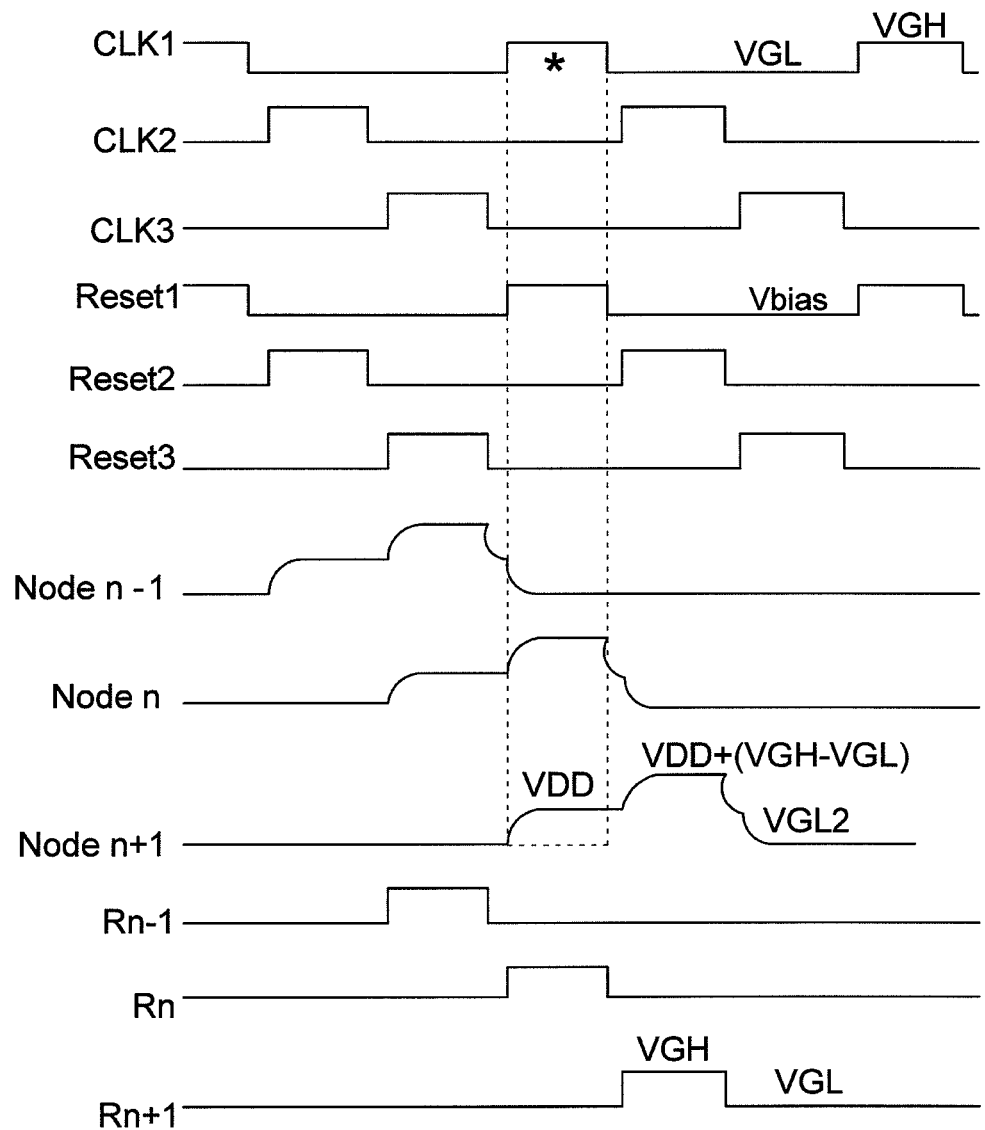
FIG. 13 is a timing diagram of FIG. 12.

FIG. 13 is a timing diagram of FIG. 12. Referring to FIG. 13, three clock signals CLK1-CLK3 and three reset signals Reset1-Reset3 are provided to the shift registers. The voltage of clock signals CLK1-CLK3 is equal to the voltage potential VGL or a voltage potential VGH. The lowest voltage of the reset signals Reset1-Reset3 are equal to the voltage potential Vbias. The clock signals CLK1-CLK3 are respectively inputted into the first switches T1 of $n_{th}$, $n+1_{th}$, $n+2_{th}$ shift registers. The reset signals Reset1-Reset3 are respectively inputted into the reset switches T3 of $n-1_{th}$, $n_{th}$, $n+1_{th}$ shift registers.

During the clock signal CLK3 or the pulse signal on the output terminal Rn−1 is enabled, the optical transmitter 51 of the previous $n-1_{th}$ shift register emits light as the optical signal to the optical receiver 52 of the current $n_{th}$ shift register. The optical TFT of the optical receiver 52 is turned on by the optical signal to couple the voltage potential VDD to the node n. In the meantime, the bootstrapping capacitor C1 is charged.

During the clock signal CLK1 is enabled, the rising edge of the clock signal CLK1 is coupled to the output terminal Rn so as to boost the voltage of the node n through the bootstrapping capacitor C1. Since the voltage of the node n rises, the first switch T1 and the second switch T2 are turned on. Then the clock signal CLK1 is smoothly inputted into the output terminal Rn and the optical transmitter 51. In the meantime, the output terminal Rn outputs the pulse signal and the optical transmitter 51 emits light as the optical signal to the next $n+1_{th}$ shift register.

During the clock signal CLK2 is enabled, the reset signal Reset2 turns on the reset switch T3. Then the node n is coupled to the voltage potential VGL2.

Figure 14:
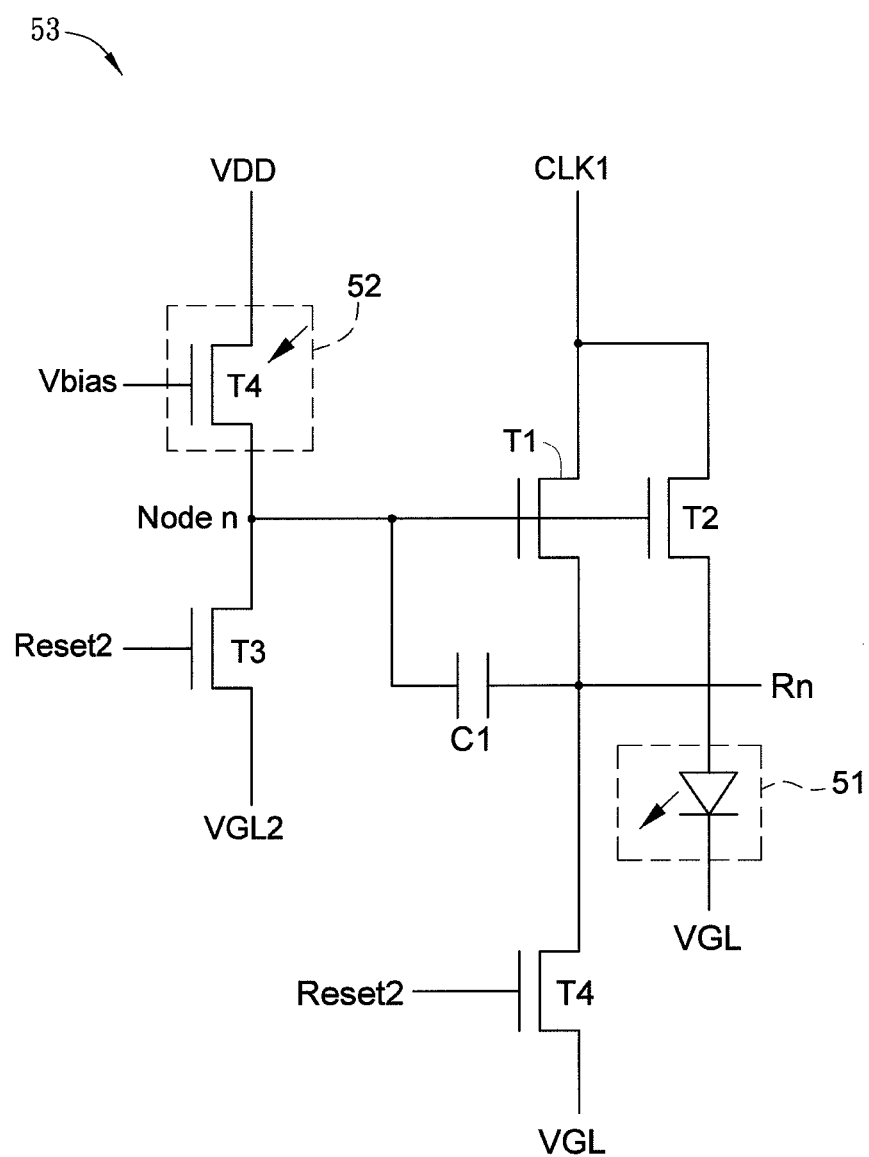
FIG. 14 is a circuit diagram showing a modification of the shift register in FIG. 12.

FIG. 14 is a circuit diagram showing a modification of the shift register in FIG. 12. Referring to FIG. 14, the driver 53 of the $n_{th}$ shift register includes a discharging switch T4 controlled by the reset signal Reset2 for coupling the output terminal Rn to the voltage potential VGL. The timing diagram for the shift register in FIG. 14 is the same with the timing diagram shown in FIG. 13, and the behavior of the shift register in FIG. 14 is similar to the shift register in FIG. 12. It is noted that during the clock signal CLK2 is enabled, the reset signal Reset2 also turns on the discharging switch T4. Then the output terminal Rn is coupled to the voltage potential VGL.

Figure 15:
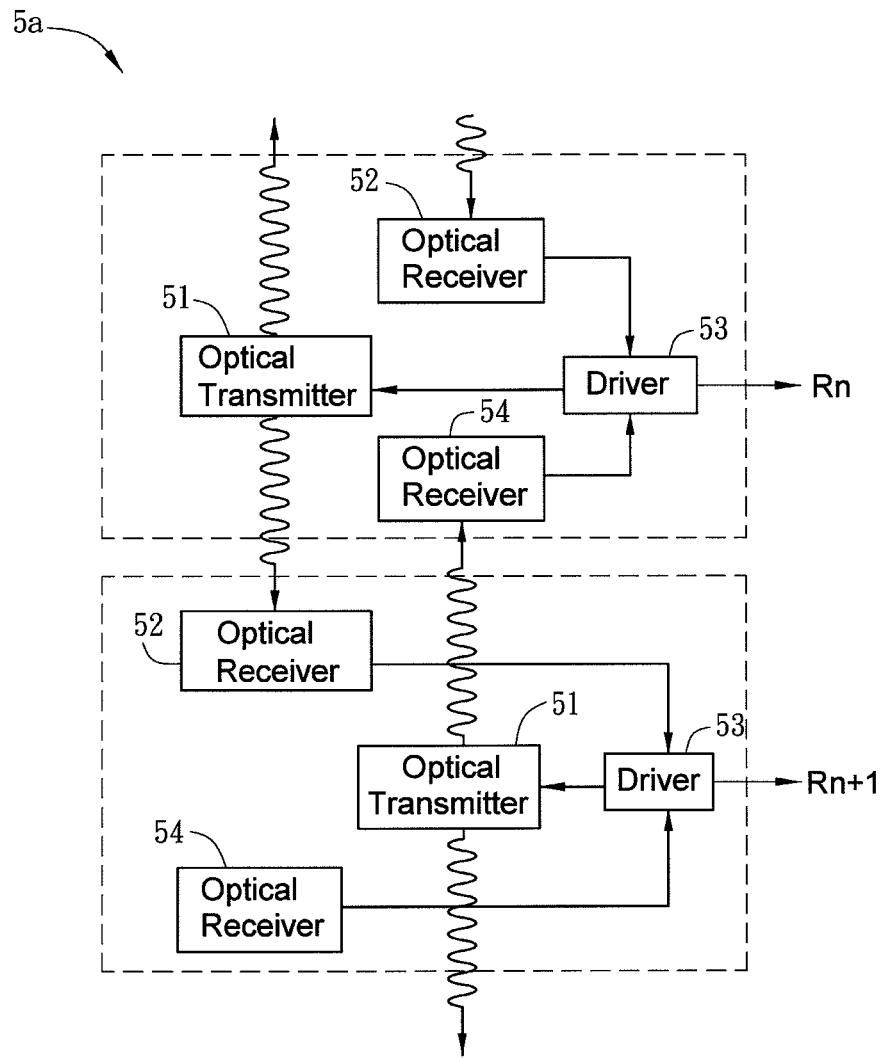
FIG. 15 is a block diagram showing a shift register circuit according to an embodiment of the present invention.

FIG. 15 is a block diagram showing a shift register circuit according to an embodiment of the present invention. Referring to FIG. 15, the reset signal can be the optical signal originated from the next shift register. The shift register circuit 5a includes a plurality of shift registers optically coupled in series. Due to brief and clear explanation, only $n_{th}$, $n+1_{th}$ shift registers are illustrated in the figure.

Each shift register includes the optical transmitter 51, the optical receiver 52, the driver 53 and an optical receiver 54. In $n_{th}$ shift register, the optical receiver 52 receives the optical signal from the previous $n-1_{th}$ shift register. The driver 53 is electrically connected to the optical receiver 52 to output the pulse signal at output terminal Rn according to the optical signal received by the optical receiver 52. The optical transmitter 51 is electrically connected to the driver 53 to transfer the optical signal. In detail, the optical transmitter 51 transmits the optical signal to the previous $n-1_{th}$ shift register and the next $n+1_{th}$ shift register based on the received optical signal from the previous $n-1_{th}$ shift register. The driver 53 is electrically connected to the optical receiver 54 to receive the optical signal from the next $n+1_{th}$ shift register, and thus reset or disable the $n_{th}$ shift register.

Figure 16:
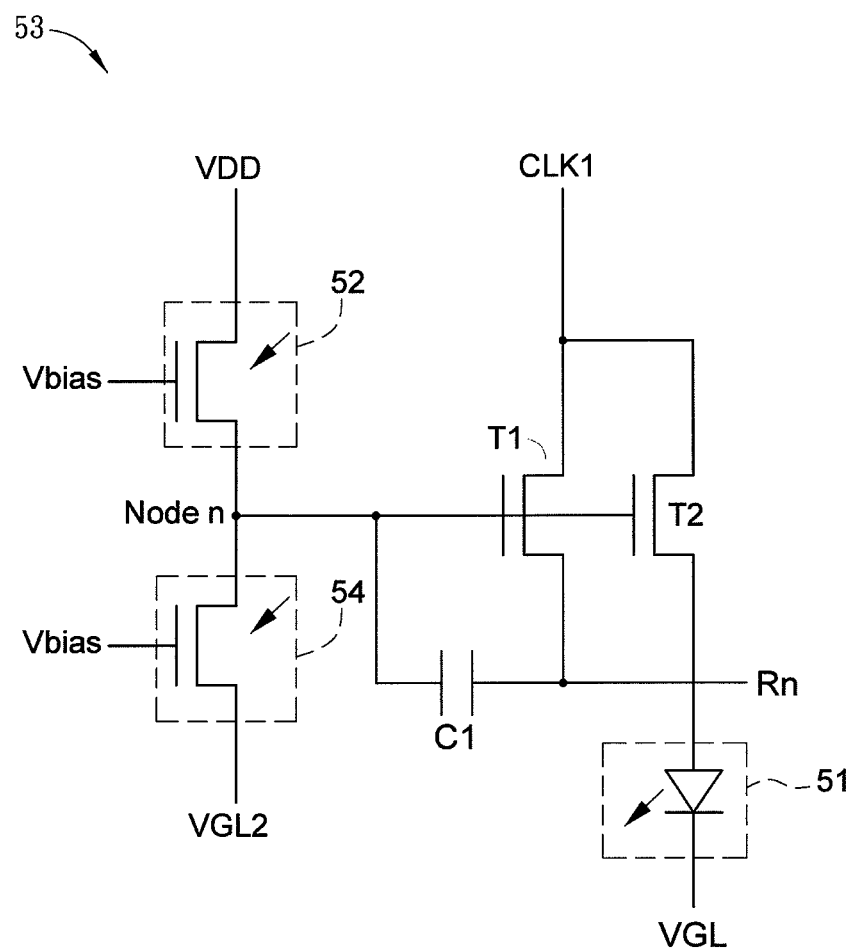
FIG. 16 is a circuit diagram showing an example of the shift register in FIG. 15.

FIG. 16 is a circuit diagram showing an example of the shift register in FIG. 15. Referring to FIG. 16, the shift register in FIG. 16 is similar to the shift register in FIG. 12, but the reset switch T3 is replaced by the optical receiver 54. The optical receiver 54 includes an optical TFT which is similar to the optical TFT of the optical receiver 52. The gate of the optical TFT of the optical receiver 54 is also coupled to the voltage potential Vbias.

Figure 17:
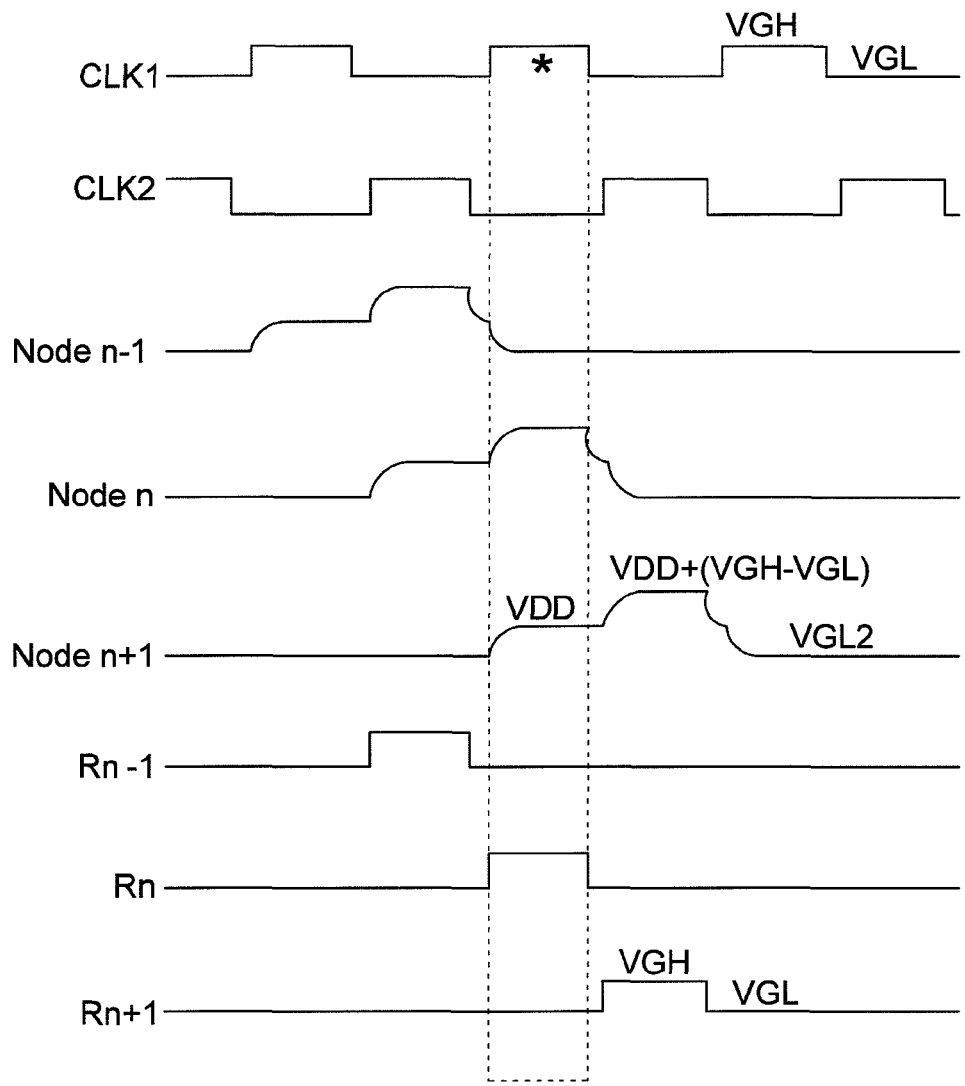
FIG. 17 is a timing diagram of FIG. 16.

FIG. 17 is a timing diagram of FIG. 16. Referring to FIG. 17, two clock signals CLK1-CLK2 are provided to the shift registers. The voltage of clock signals CLK1-CLK2 are equal to the voltage potential VGL or the voltage potential VGH. The clock signals CLK1-CLK2 are respectively inputted into the first switches T1 of $n_{th}$ and $n+1_{th}$ shift registers.

During the clock signal CLK2 or the pulse signal on output terminal Rn−1 is enabled, the optical transmitter 51 of the previous $n-1_{th}$ shift register emits light as the optical signal to the optical receiver 52 of the $n_{th}$ shift register. The optical TFT of the optical receiver 52 is turned on by the optical signal to couple the voltage potential VDD to node n. In the meantime, the bootstrapping capacitor C1 is charged.

Next, during the clock signal CLK1 is enabled, the rising edge of the signal CLK1 is coupled to the output terminal Rn so as to boost the voltage of the node n through the bootstrapping capacitor C1. Since the voltage of the node n rises, the first switch T1 and the second switch T2 are turned on. Then the clock signal CLK1 is smoothly inputted into the output terminal Rn and the optical transmitter 51. In the meantime, the output terminal Rn outputs the pulse signal and the optical transmitter 51 emits light as the optical signal to the previous $n-1_{th}$ shift register and the next $n+1_{th}$ shift register. The optical signal turns on the optical receiver 54 of the previous $n-1_{th}$ shift register, and thus the node n−1 is coupled to the voltage potential VGL2.

Figure 18:
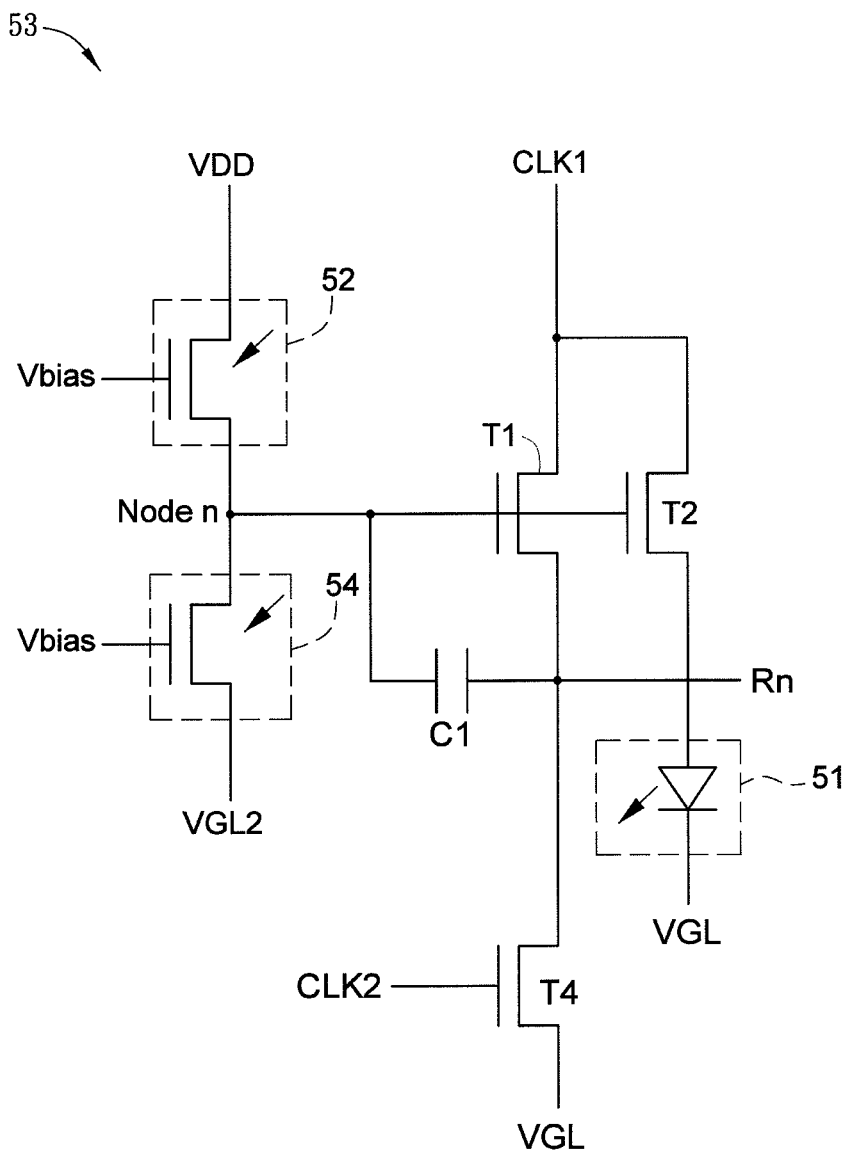
FIG. 18 is a circuit diagram showing a modification of the shift register in FIG. 16.

FIG. 18 is a circuit diagram showing a modification of the shift register in FIG. 16. Referring to FIG. 18, the driver 53 of the $n_{th}$ shift register includes the discharging switch T4 controlled by the clock signal CLK2 for coupling the output terminal Rn to the voltage potential VGL. During the clock signal CLK2 is enabled, it turns on the discharging switch T4 and then the output terminal Rn is coupled to the voltage potential VGL. The timing diagram for the shift register in FIG. 18 is the same with timing diagram shown in FIG. 16, and the behavior of the shift register in FIG. 18 is similar to the shift register in FIG. 16.

Figure 19:
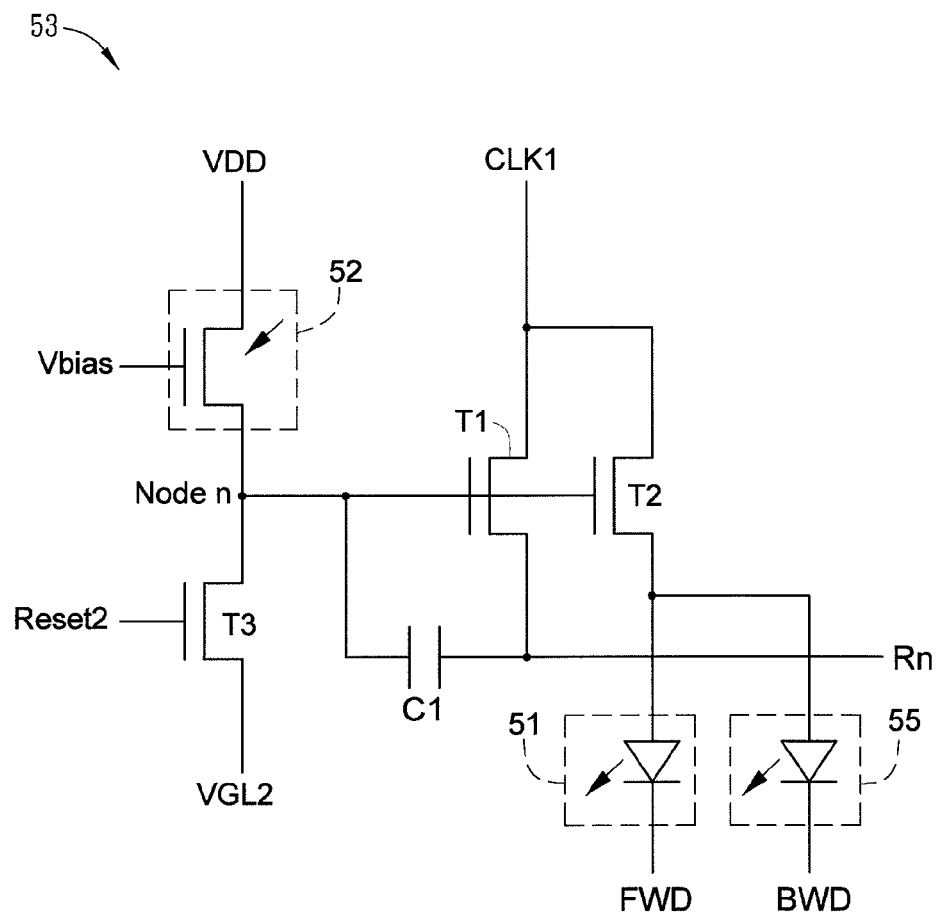
FIG. 19 is a circuit diagram showing a shift register according to an embodiment of the present invention.

FIG. 19 is a circuit diagram showing a shift register according to an embodiment of the present invention. Referring to FIG. 19, the shift register in FIG. 19 is similar to the shift register in FIG. 12, but the shift register circuit can scan in dual directions. The shift register in FIG. 19 includes an optical transmitter 55. In $n_{th}$ shift register, the optical transmitter 51 is only coupled to the optical receiver 52 of the next n+1$_{th}$ shift register, and the optical transmitter 55 is only coupled to the optical receiver 52 of the previous n−1$_{th}$, shift register. Two nodes of the optical transmitter 51 are respectively coupled to the second switch T2 and a voltage potential FWD. Two nodes of the optical transmitter 55 are respectively coupled to the second switch T2 and a voltage potential BWD.

Figure 20:
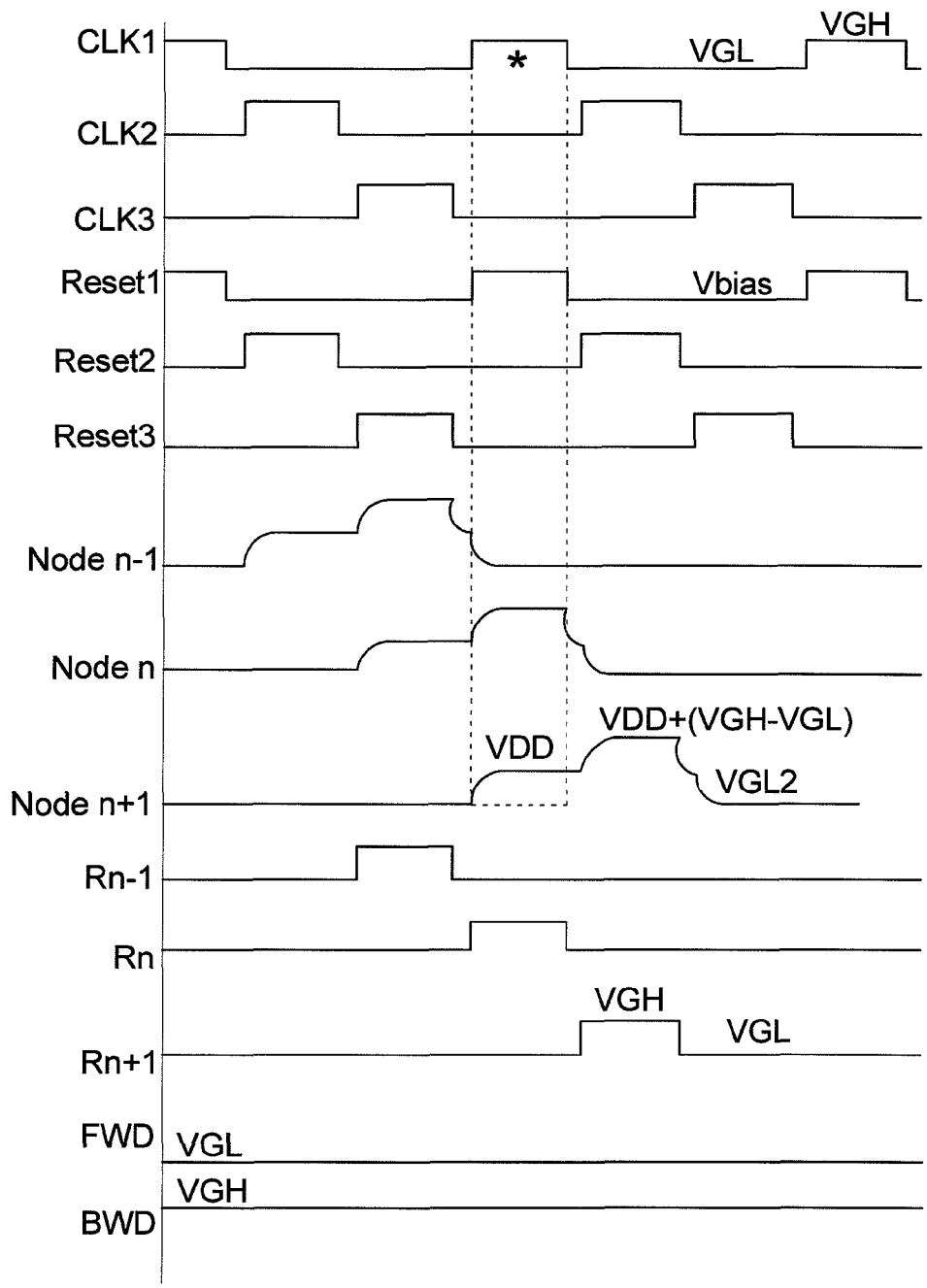
FIG. 20 is a timing diagram of FIG. 19.

FIG. 20 is a timing diagram of FIG. 19. Referring to FIG. 20, the timing diagram of FIG. 20 for the shift register in FIG. 19 is similar to the timing diagram shown in FIG. 13. When the shift register circuit is scanned in forward scan direction, the voltage potential FWD is set equal to the voltage potential VGL, and the voltage potential BWD is set equal to the voltage potential VGH. When the shift register circuit is scanned in backward scan direction, the voltage potential FWD is set equal to the voltage potential VGH, and the voltage potential BWD is set equal to the voltage potential VGL.

Each of the switches of the shift register in FIGS. 12, 14, 16, 18 and 19 can be an enhancement type TFT, a depletion type TFT, a combination of enhancement type TFT and a depletion type TFT, an organic TFT, an oxide TFT, an Indium-Gallium-Zinc Oxide TFT, a low temperature poly-crystalline silicon TFT (LTPS-TFT), or an amorphous silicon TFT (aSi-TFT).

In addition, the TFT of the optical receiver as discussed above can be enhancement type TFT, depletion type TFT, a combination of enhancement type TFT and a depletion type TFT, an organic TFT, an oxide TFT, an Indium-Gallium-Zinc Oxide TFT, a low temperature poly-crystalline silicon TFT (LTPS-TFT), or an amorphous silicon TFT (aSi-TFT).

In summary, the display device and shift register circuit of the present invention utilize the optical coupler to transfer signal. It benefits that the signal transmission can be implemented with compact electronic elements and less electric noise.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display device, comprising:
   a substrate; and
   a shift register circuit, comprising a plurality of shift registers optically coupled in series, each shift register comprising:
   an optical receiver, for receiving an optical signal from the previous shift register;
   an optical transmitter for transmitting the optical signal to the next shift register;
   a first switch, wherein a first terminal of the first switch is connected to the optical receiver, a second terminal of the first switch is coupled to a clock signal, and a third terminal of the first switch is connected to an output terminal;
   a second switch, wherein a first terminal of the second switch is connected to the optical receiver, a second terminal of the second switch is coupled to the clock signal, and a third terminal of the second switch is connected to the optical transmitter; and
   a bootstrapping capacitor, wherein a first terminal of the bootstrapping capacitor is connected to the optical receiver, the first terminal of the first switch and the first terminal of the second switch, and a second terminal of the bootstrapping capacitor is connected to the output terminal,
   wherein the optical transmitter comprises an organic light emitting diode (OLED), the optical receiver comprises an optical thin film transistor (TFT), and the conductance of the optical thin film transistor is controlled by the optical signal; and
   wherein the optical coupler further comprises an optical reflector for reflecting the optical signal from the optical transmitter to the optical receiver.

2. The display device according to claim 1, wherein the optical transmitter transforms an electrical signal to the optical signal, and the optical receiver transforms the optical signal to the electrical signal.

3. The display device according to claim 1, wherein the optical transmitter and the optical receiver are vertically arranged on the substrate.

4. The display device according to claim 1, further comprising:
   a plurality of pixels, each of which comprises a light emitting unit for displaying.

5. The display device according to claim 4, wherein each of the light emitting unit and the optical transmitter is an organic light-emitting diode (OLED).

6. The display device according to claim 4, wherein the wavelength of the optical signal is different from the wavelength of the light emitted by the light emitting unit for displaying.

7. The display device according to claim 1, wherein the optical signal controls the optical receiver to electrically charge the bootstrapping capacitor such that the first switch and the second switch are turned on so as to output a pulse signal on the output terminal and transfer the optical signal from the optical transmitter, wherein the optical receiver is controlled by the optical signal to couple a first voltage potential to the first terminals of the first switch and the second switch.

8. The display device according to claim 7, wherein the shift register further comprises:
   a reset switch for coupling the first terminal of the first switch to a second voltage potential or the other optical signal from the next shift register.

9. The display device according to claim 7, wherein two nodes of the optical transmitter are respectively coupled to the second switch and a third voltage potential.

10. The display device according to claim 9, wherein the shift register further comprises:
    a discharging switch controlled by a reset signal for coupling the output terminal to the third voltage potential.

11. A shift register circuit comprising:
    an optical receiver, for receiving an optical signal from a previous shift register;
    an optical transmitter for transmitting the optical signal to a next shift register;
    a first switch, wherein a first terminal of the first switch is connected to the optical receiver, a second terminal of the first switch is coupled to a clock signal, and a third terminal of the first switch is connected to an output terminal;
    a second switch, wherein a first terminal of the second switch is connected to the optical receiver, a second terminal of the second switch is coupled to the clock signal, and a third terminal of the second switch is connected to the optical transmitter; and
    a bootstrapping capacitor, wherein a first terminal of the bootstrapping capacitor is connected to the optical receiver, the first terminal of the first switch and the first terminal of the second switch, and a second terminal of the bootstrapping capacitor is connected to the output terminal, wherein the optical transmitter comprises an organic light emitting diode (OLED), the optical receiver comprises an optical thin film transistor (TFT), and the conductance of the optical thin film transistor is controlled by the optical signal; and wherein the optical coupler further comprises an optical reflector for reflecting the optical signal from the optical transmitter to the optical receiver.

12. The shift register circuit according to claim 11, wherein the optical signal controls the optical receiver to electrically charge the bootstrapping capacitor such that the first switch and the second switch are turned on so as to output a pulse signal on the output terminal and transfer the optical signal from the optical transmitter, wherein the optical receiver is controlled by the optical signal to couple a first voltage potential to the first terminals of the first switch and the second switch.

13. The shift register circuit according to claim 12, wherein the shift register further comprises:
a reset switch for coupling the first terminal of the first switch to a second voltage potential or the other optical signal from the next shift register.

14. The shift register circuit according to claim 12, wherein two nodes of the optical transmitter are respectively coupled to the second switch and a third voltage potential.

15. The shift register circuit according to claim 14, wherein the shift register further comprises:
a discharging switch controlled by a reset signal for coupling the output terminal to the third voltage potential.

* * * * *